US007027322B2

(12) United States Patent
Suzuki et al.

(10) Patent No.: US 7,027,322 B2
(45) Date of Patent: Apr. 11, 2006

(54) EPIR DEVICE AND SEMICONDUCTOR DEVICES UTILIZING THE SAME

(75) Inventors: Toshimasa Suzuki, Tokyo (JP); Yuji Nishi, Tokyo (JP); Masayuki Fujimoto, Hamamatsu (JP); Nobuyoshi Awaya, Osaka (JP); Kohji Inoue, Osaka (JP); Keizo Sakiyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 179 days.

(21) Appl. No.: 10/790,238

(22) Filed: Mar. 2, 2004

(65) Prior Publication Data

US 2005/0040482 A1    Feb. 24, 2005

(30) Foreign Application Priority Data

Mar. 7, 2003    (JP)    ............................. 2003-060965

(51) Int. Cl.
*G11C 11/00*    (2006.01)
(52) U.S. Cl. .................. 365/158; 365/50; 365/145; 365/157; 365/171; 257/295; 257/296; 257/297; 257/298; 257/299; 257/300; 438/3
(58) Field of Classification Search ................ 365/50, 365/154, 157, 158, 171; 257/295–300; 438/3
See application file for complete search history.

(56) References Cited

U.S. PATENT DOCUMENTS

| 5,549,978 | A | * | 8/1996 | Iwasaki et al. | .......... | 428/811.2 |
| 5,589,278 | A | * | 12/1996 | Kamijo | .................... | 428/811.3 |
| 6,204,139 | B1 | | 3/2001 | Liu et al. | | |
| 6,430,012 | B1 | * | 8/2002 | Sano et al. | .............. | 360/324.1 |
| 6,649,957 | B1 | * | 11/2003 | Hsu et al. | .................... | 257/295 |
| 6,693,821 | B1 | * | 2/2004 | Hsu et al. | .................... | 365/158 |
| 6,858,905 | B1 | * | 2/2005 | Hsu et al. | .................... | 257/385 |
| 6,861,687 | B1 | * | 3/2005 | Hsu et al. | .................... | 257/295 |
| 6,927,074 | B1 | * | 8/2005 | Hsu et al. | ....................... | 438/3 |

(Continued)

FOREIGN PATENT DOCUMENTS

| JP | 10-255481 A | 9/1998 |
| JP | 10-261291 A | 9/1998 |

OTHER PUBLICATIONS

Liu, "Electric-Pulse-Induced Reversible Resistance Change Effect in Magnetoresistive Films", Applied Physics Letters, vol. 76, No. 19, May 8, 2000, American Institute of Physics, pp. 2749-2751.

(Continued)

*Primary Examiner*—George Eckert
*Assistant Examiner*—Mursalin B. Hafiz
(74) *Attorney, Agent, or Firm*—Nixon & Vanderhye, P.C.

(57) ABSTRACT

There is provided an EPIR device which is excellent in mass productivity and high in practical utility.

The EPIR device includes a lower electrode layer, a CMR thin film layer and an upper electrode layer which are laminated in this order on any of various substrates. A Pt polycrystal thin film 10 forming the lower electrode layer includes columnar Pt crystal grains 10A, 10B, 10C, . . . and over 90% of these crystal grains is oriented to a (1 1 1) face. Columnar PCMO crystal grain groups 20A, 20B, 20C, . . . are respectively locally grown epitaxially on the respective outermost surfaces of the Pt crystal grains 10A, 10B, 10C, . . . . Then, the crystal faces of the crystal grains included in the PCMO crystal grain groups 20A, 20B, 20C, . . . and vertical in the substrate surface normal direction are any one of $(1\ 0\ 0)_p$, $(1\ 1\ 0)_p$ and $(1\ 1\ 1)_p$ planes.

27 Claims, 10 Drawing Sheets

U.S. PATENT DOCUMENTS

2004/0228171 A1*  11/2004  Ho et al. .................... 365/158
2004/0233708 A1*  11/2004  Hsu et al. .................. 365/158
2005/0054119 A1*   3/2005  Hsu et al. ..................... 438/3
2005/0124112 A1*   6/2005  Hsu et al. .................. 438/250
2005/0145910 A1*   7/2005  Tamai et al. ............... 257/296
2005/0153504 A1*   7/2005  Kawazoe et al. .......... 438/222

OTHER PUBLICATIONS

Miyake, "Flash Memory vs. New Nonvolatile Memory, Part 2 (Flash Memory Overwhelming Stand-Alone, and New Promising RRAM)", Nikkei Microdevices, Jan. 2003, pp. 72-83 and partial English transmittal.

* cited by examiner (A)

(110)p [=(112)]-ORIENTED PCMO COLUMNER CRYSTAL GRAIN RA2

(110)p [=(100)]-ORIENTED PCMO COLUMNER CRYSTAL GRAIN RA1

RB1
(111)p-ORIENTED PCMO COLUMNER CRYSTAL GRAIN (B)

RA1

RB1

RA2

(A)

(B)

(A)

(B)

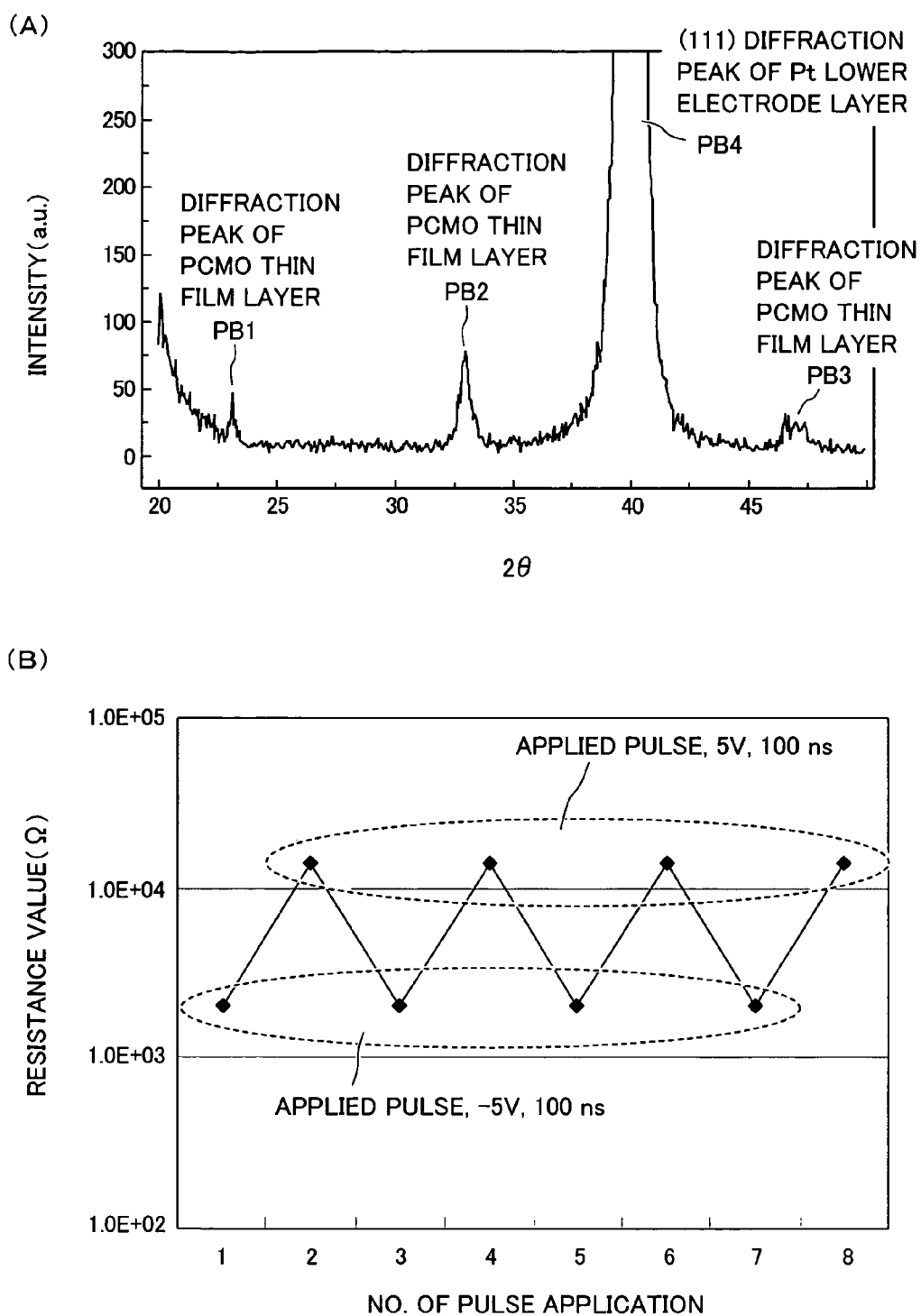

EPIR DEVICE AND SEMICONDUCTOR DEVICES UTILIZING THE SAME

FIELD OF THE INVENTION

The present invention relates to a device utilizing a pulse field-induced resistance variation in materials having a magneto-resistance effect and semiconductor devices employing the same.

BACKGROUND OF THE INVENTION

Recently, various device structures, such as, FERAM (ferro-electric RAM), MRAM (magnetic RAM) and OUM (ovonic unified memory) have been proposed as the next-generation nonvolatile random access memories (NVRAM) capable of high speed operation so as to replace the flash memories, and they have been examined from the standpoint of improved functions, higher reliability, reduced cost, process matching, etc.

However, ideal general-purpose memories, so-called universal memories have been required to be such that they are capable of high speed access as in the case of the SRAM, capable of high degree of integration as in the case of the DRAM, having nonvolatility and low in power consumption as in the case of the flash memories, and previously mentioned various memories have been unable to meet these demands.

The characteristic features of the previously mentioned memories are as follows.

(1) FeRAM—This memory utilizes a spontaneous polarization reversing phenomenon of oxide ferroelectric materials and it features a low power consumption and high speed operation. Although it has been put in practical use, it is inferior from the standpoint of reliability, reduction in cell area, high cost and destructive reading.

(2) MRAM—This memory is one utilizing a GMR (giant magneto-resistance) effect. The ferro-magnetic tunnel effect device has a structure such that two ferro-magnetic material layers of Fe, Co, Ni or the like are held between very thin insulating layers (tunnel barrier layers) of $Al_2O_3$ or the like, and the direction of magnetization (spin) of the ferro-magnetic material layers is changed to control the magnitude of the tunnel current flowing through the insulating layers and thereby to develop a memory effect. There are problems that power consumption is high at magnetization reversal during the writing and that the desired sliming is difficult.

(3) OUM—The memory is one based on the thermal phase transformation of a chalcogenite material. While this is superior in terms of low cost and process matching, there are still problems in terms of sliming and high speed operation due to its thermal operation.

In contrast to these existing memories, Shangquing liu, Alex Ignatiev, etc., of Houston university have invented a resistance random access memory (hereinafter referred to as a [RRAM]) which is closer to the concept of universal memory. This RRAM is a resistance random access memory device utilizing an electrical-pulse-induced-resistance effect (hereinafter referred to as an EPIR effect) which has been discovered newly in materials having a colossal magneto-resistance: CMR) effect (refer to patent literature 1, non-patent literature 1 and non-patent literature 2). Note that in the discussion to follow, those materials having a perovskite type structure showing an electrical resistivity variation ranging to as high as a number of three figures due to the application of a field which is characterized by the colossal magneto-resistance effect, that is, a field-induced anti-ferromagnetic insulator to ferromagnetic metal transition phenomenon are defined as CMR materials. Also, any device utilizing the EPIR effect is defined as an EPIR device.

The CMR material is typically represented by a Mn type oxide material having the perovskite type structure and it exhibits a magnetic field dependent resistivity variation ranging as large as a number of three figures and relating to the field-induced anti-ferromagnetic insulator to ferromagnetic metal transition phenomenon as mentioned previously. However, the material singly requires the application of a considerably large magnetic field (of an order of several teslas) in order to obtain a high magneto-resistance effect. In addition, there are problems that as in the case of the previously mentioned MRAM, a high degree of boundary control is required even in the case of a device having a magnetic tunnel structure capable of operating at a weak magnetic field of about 0.1 tesla utilizing the spin polarization rate of the CMR material which is as close as 100%. Note that while it has been discovered that the switching can be effected by means of an electrical field or a light in addition to a magnetic field as an external perturbation for controlling the resistance variation (patent literatures 2 and 3) with these Mn type oxide materials, all of them are operations in low temperature regions and therefore cannot be said to be practical always.

On the other hand, the CMR materials showing the EPIR effect are typically represented by those having the perovskite structure based on the network of oxygen-octahedrals centering on 3d-transition metallic elements, more specifically $Pr_{1-x}Ca_xMnO_3$ (hereinafter referred to as a [PCMO]), $La_{1-x}Ca_xMnO_3$, $La_{1-x}Sr_xMnO_3$, $Gd_{0.7}Ca_{0.3}BaCO_2O_{5+\delta}$ and the like. It has been said that of these materials, the PCMO having the composition close to x=0.3 shows the widest range of resistance value variation.

The EPIR effect of such CMR material is quite epoch making in that a resistance variation ranging up to a number of several figures is produced without any need of magnetic field application even at room temperature. The RRAM utilizing this phenomenon requires no magnetic field at all and therefore the consumption of power is extremely low as compared with the previously mentioned MRAM. In addition, there are excellent features that the realization of slimming and high degree of integration is easy and the dynamic range of resistance variation is markedly wide as compared with the MRAM, thus making it possible to effect a multi-valued memory operation.

The basic structure of the CMR material portion in the actual memory device is extremely simple so that it is only necessary to laminate a lower electrode layer, a CMR thin film layer and an upper electrode layer in this order on the principal surface of a substrate. By controlling the polarity, voltage and pulse duration of electrical pulses applied across the upper electrode layer and the lower electrode layer, respectively, in a wide range of several tens ns to several μs, it is possible to vary the resistance of the CMR thin film layer held between the upper and lower electrode layers thereby to perform a memory operation. The resistance value of the CMR thin film layer varied by the application of these pulses is maintained over a long period of time even after the application of the pulses so that if, for example, the low resistance state represents a logical value "0" and the high resistance state represents a logical value "1", it is possible to obtain a nonvolatile memory function. In addition, by controlling the pulse duration, applied voltage and number of pulses, it is possible to realize a multi-valued memory operation based on a stepwise variation of resistance value with a margin which is several hundred times the variation of resistance value attained in the MRAM.

Then, while the materials used for the electrodes of the above-mentioned multilayer structure include metal types, such as, Pt, Ir, Ru, Ph, Ag, Au, Al and Ta, or materials which are higher in conductivity than the CMR material, such as, oxides including $YBa_2Cu_3O_{7-x}$, $RuO_2$, $IrO_2$ and $SrRuO_3$ and nitride type compounds, such as, TaSiN, TiN, TiSiN and MoN, the lower electrode layer is at a high temperature of 400° C.~600° C. and also exposed to an atmosphere having a high oxygen partial pressure during the formation of the CMR layer. Thus, the range of selection of materials used for the lower electrode layer is limited.

Also, when selecting the lower electrode, it is necessary to take into consideration the standpoint of lattice matching between it and the CMR material. Such CMR material which reveals an excellent EPIR effect is strained from the ideal cubic-system perovskite structure and thus the transition metal-oxygen bonding network is greatly bent giving rise to anisotropic properties. As a result, in the case of a randomly oriented CMR thin film ignoring the crystal axis orientation, the problems of uniformity of characteristics in the substrate surface and the lot-to-lot process reproducibility are actualized due to the reduction in cell area. Further, it is necessary to take into consideration the promotion of crystallization of the CMR material due to the base structure transfer caused by such lattice matching and the improvement in characteristic due to the higher crystallization.

As a result, it is considered that in order to attain the improvement in characteristic and the control of characteristic in the light of mass production, it is effective that ① a lower electrode material is selected which is easy in orientation control and having the desired lattice matching with the CMR material, and ② the orientations in the substrate normal direction of the crystal axes of CMR crystals to be epitaxially grown are made uniform.

[Patent Literature 1]
Specification of U.S. Pat. No. 6,204,139
[Patent Literature 2]
Japanese Laid-Open Patent Publication No.10-261291
[Patent Literature 3]
Japanese Laid-Open Patent Publication No.10-255481
[Non-Patent Literature 1]
Applied Physics Letter, 76, 2749–2751 (2000), "Electrical-pulse-induced reversible resistance effect in magneto-resistive films,"
[Non-Patent Literature 2]
Nikkei Microdevice, 2003, January Number, pp.72–83

SUMMARY OF THE INVENTION

However, the previously mentioned examination of the orientation control in the conventional CMR thin film layer/lower electrode layer multilayer structures has been aimed at only the structures made by the perfect epitaxy employing single crystal oxide substrates, and therefore it is not considered to be necessarily realistic from the standpoint of mass productivity.

The present invention has noted these points and it is an object of the invention to provide an EPIR device which is excellent in mass productivity and high in practical utility. It is another object of the present invention to provide such EPIR device having improved EPIR characteristics, improved uniformity of characteristic in a substrate surface and improved lot-to-lot process reproducibility and semiconductor devices utilizing the same.

In order to achieve the above objects, the present invention is comprised of an EPIR device having a structure in which a lower electrode layer, a CMR material thin film layer and an upper electrode layer are laminated in this order, and it features that the CMR material thin film with controlled orientations is formed on the lower electrode layer made of a polycrystal noble metal material which is excellent in lattice matching with the CMR material.

Another invention features that the lower electrode is made of a metal material including a noble metal singly or an alloy thereof as its principal component, that a large part of the crystal orientations of the lower metal electrode layer arranged in a substrate surface vertical direction is oriented to a (1 1 1) face, and that a large part of the crystal grains of the CMR material thin film layer is locally grown epitaxially on the metal crystal grains of the lower metal electrode layer whose outermost surfaces are the (1 1 1) faces.

Still another invention features that the lower electrode layer is made of a metal material whose principal component is a noble metal singly or its alloy, that a large part of the crystal grains of the CMR material thin film layer is locally grown epitaxially on the crystal grains of the lower metal electrode, and that the crystal faces of the epitaxially grown crystal grain groups of the CMR material thin film layer which are vertical in the substrate surface normal direction correspond to any one of $(1\ 0\ 0)_p$, $(1\ 1\ 0)_p$ and $(1\ 1\ 1)_p$ planes.

Still another invention features that the lower electrode layer is made of a metal material whose principal component is a noble metal singly or its alloy, that a large part of the lower metal electrode layer is oriented to a (1 1 1) face, that a large part of the crystal grains of the CMR material thin film layer is locally grown epitaxially on the metal crystal grains of the lower metal electrode layer whose outermost surfaces are the (1 1 1) faces, and that the crystal faces of the epitaxially grown crystal grain groups of the CMR material thin film layer which are vertical in the substrate surface normal direction correspond to any one of $(1\ 0\ 0)_p$, $(1\ 1\ 0)_p$ and $(1\ 1\ 1)_p$ planes.

The above and other objects, features and advantages of the present invention will become apparent from the following detailed description and the accompanying drawings.

BRIEF DESCRIPTION OF THE DRAWINGS

[FIG. 10] Diagrams showing the results of observation of the lower electrode and the CMR thin film and the variation in resistance in the EPIR device when the substrate having a high crystallizability is used. (A) shows the results of observation by the XRD, and (B) shows the variation in resistance upon the application of the pulse reversed in polarity.

DETAILED DESCRIPTION

<Fundamental Matters>

Figure 1:
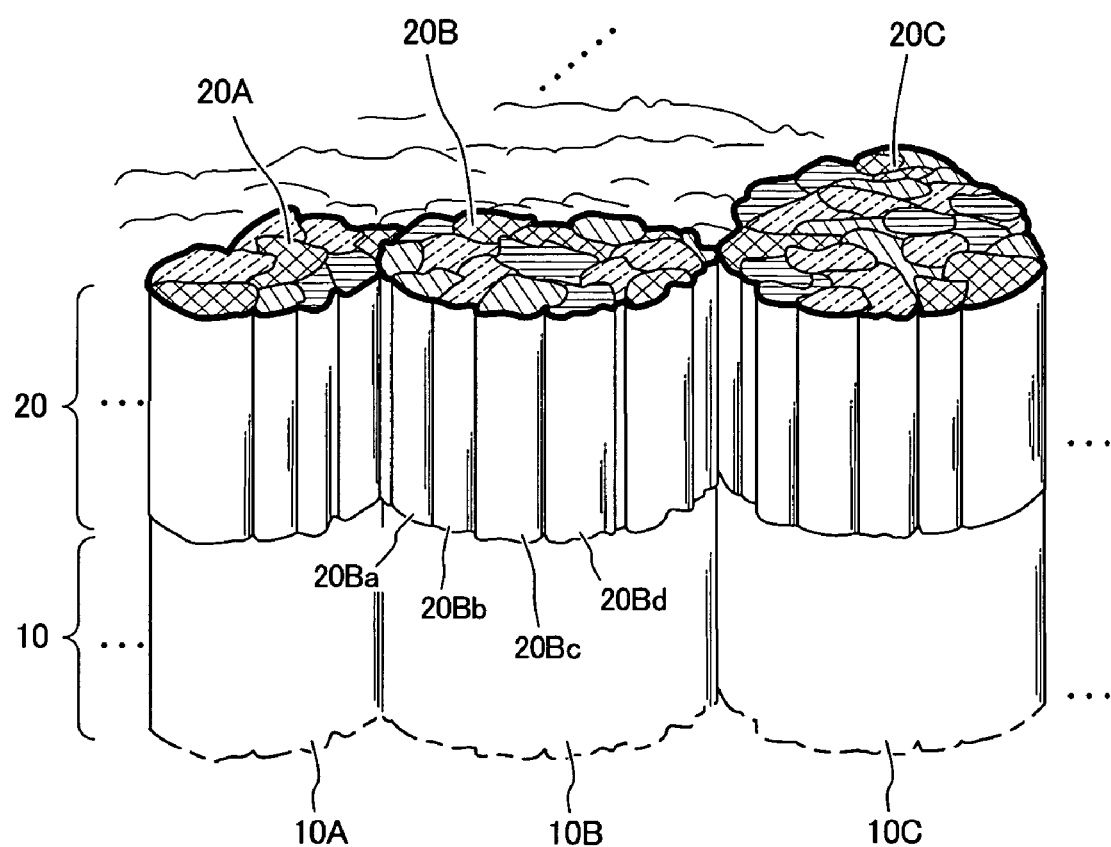
[FIG. 1] A schematic diagram showing the manner of formation of the crystal grains of a lower electrode and a CMR material in an EPIR device according to the present invention.

The present invention is based on the following knowledge relating to PCMO thin films grown on Pt polycrystal thin films. More specifically, the Pt polycrystal thin film has a high degree of orientation properties with respect to a crystal plane face (111) (here, the term orientation means the arrangement of the crystal orientations in the substrate surface vertical direction. The same shall apply hereinafter.) and also it has a high degree of lattice match with perovskite type Mn oxides. When a PCMO thin film, one of the perovskite type Mn oxides, is to be epitaxially grown on such Pt polycrystal thin film, by properly setting such film forming conditions as substrate temperature, oxygen partial pressure, film forming rate and total pressure, PCMO thin film crystals can be locally grown epitaxially on the respective Pt crystal grains to thereby obtain a PCMO thin film having a high degree of orientation.

Also, the orientation faces of the above-mentioned PCMO thin film are not limited to the single crystal face and have a plurality of crystal faces. For purposes of promoting the understanding, suppose that the crystal system of the PCMO material, which is the rhombic crystal system, consists of quasi-cubic crystals corresponding to the basic perovskite structure units and the crystal faces of the quasi-cubic crystals are designated for purposes of simplification by indices (h k l)p with the addition of a subindex [p] (h, k and 1 are integers), crystals having crystallographic axis orientations $(1\ 1\ 0)_p$, $(1\ 1\ 1)_p$ and $(1\ 0\ 0)_p$ can be selectively grown by suitably adjusting the film forming conditions. Then, this highly oriented PCMO thin film shows excellent switching characteristics and it also manifests excellent uniformity in characteristic in the same substrate surface and among the manufactured lots (continuous substrate-to-substrate uniformity).

While the lattice mismatch is somewhat high, namely about 2%, between the PCMO (the lattice constant $a_p$=0.385 nm) and Pt (the lattice constant a=0.392 nm), they have structurally a high degree of matching and thus they have a sufficient possibility of epitaxial growth. Judging from the view point of the usual epitaxial growth conditions, it is presumed that a PCMO thin film oriented to the $(1\ 1\ 1)_p$ plane and most excellent in lattice match can be grown most stably epitaxially on Pt crystal grains oriented to the (1 1 1) plane. In this connection, according to our knowledge, actually the use of the optimized film forming conditions also allows the growth of PCMO thin film crystal grains oriented to the $(1\ 1\ 0)_p$ or $(1\ 0\ 0)_p$ plane face and they all show an epitaxial growth form having a crystallographical orientation relation with the base Pt crystal grains in the substrate surface. For instance, the presence of an orientation relation of Pt (1 1 1) [1 1-2][1-1 0]//PCMO $(1\ 1\ 0)_p$ $[1\text{-}1\ 0]_p$ $[0\ 0\ 1]_p$ in the case of $(1\ 1\ 0)_p$ plane has been confirmed by the TEM observation in the thin film surface that will be described latter.

Regarding the mechanism relating to the detailed structural stability of the above-mentioned boundary structure, it has been found to be difficult to make a strict discussion due to complicate phenomena governed by a non-equilibrium crystal growth. Generally, at the grain boundary of metal-ion type oxide e.g., Pt-PCMO boundary, there exists a high degree of freedom as compared with other covalent-bond boundary and ionic-bond boundary and thus there is a tendency that the stability is easily attained due to a geometrical match of higher order and that the contribution of boundary surface energy is decreased. As a result, at the metal-ion type oxide boundary surface, the orientations of crystal growth are not always determined by the discussion based on the surface energy due to only the difference in lattice constant between the unit cells and are determined by various complex factors including the decreased surface energy at the lattice match of higher order, the form of surface growth, the surface energy and the like. It is to be noted that the process factors tending to affect the orientation properties of crystals may be exemplified by the rate of crystal growth. On the other hand, while, in the lower Pt electrode thin film, a mixed phase of the (1 1 1) orientation and the (1 0 0) orientation tends to be easily obtained under unoptimal conditions, as a result of the optimization of film forming conditions which is relatively easy, there occurs a preferred orientation to the closest packed crystal plane (1 1 1) using the decreased surface energy as a driving force thus obtaining a polycrystal structure of uniaxial orientation properties. Also, the introduction of oxygen in the sputtering-process film formation has the effect of producing a Pt thin film preferentially oriented to the (1 0 0) face and in this case it is possible to form a more stable PCMO thin film oriented to the $(1\ 0\ 0)_p$ plane on the Pt electrode layer.

The EPIR device of the present invention is one in which the lower electrode layer, the CMR thin film layer and the upper electrode layer according to the above-mentioned knowledge are laminated in this order on any of various substrates. FIG. 1 schematically shows the manner in which a PCMO thin film 20 is formed on a Pt polycrystal thin film 10 constituting a lower electrode layer. The Pt polycrystal thin film 10 includes columnar Pt crystal grains 10A, 10B, 10C, . . . and over 70%, preferably over 90%, of these grains have their crystal orientations in the substrate surface vertical direction arranged so as to be oriented to the (1 1 1) plane face. Columnar PCMO crystal grain groups 20A, 20B, 20C, . . . are respectively locally grown epitaxially on the respective outermost surfaces of the Pt crystal grain groups 10A, 10B, 10C, . . . which are oriented to the (1 1 1) face, and these crystal grain groups are respectively composed of columnar PCMO crystal grains 20Ba, 20Bb, 20Bc, 20Bd, . . . which are smaller in grain size. The crystal grains 20Ba, 20Bb, 20Bc, 20Bd, . . . are respectively grown epitaxially on the columnar Pt crystal grains 10B oriented to the same (1 1 1) face and over 60%, preferably over 80%, are oriented to any one of the $(1\ 0\ 0)_p$, $(1\ 1\ 0)_p$ and $(1\ 1\ 1)_p$ planes, whereas over 60%, preferably over 80% of the CMR thin film layer 20 is, on the whole, oriented to any one of the $(1\ 0\ 0)_p$, $(1\ 1\ 0)_p$ and $(1\ 1\ 1)_p$ planes. It is to be noted that, even if the columnar PCMO crystal grains 20Ba, 20Bb, 20BC, 20BD, . . . on the Pt crystal grains 10B which are oriented to the (1 1 1) face, are oriented to the same direction, they are not always the same in in-plane orientation and they have several specific crystallographic orientation relations. For instance, assuming that the CMR thin film layer 20, on the whole, is oriented to the $(1\ 1\ 0)_p$ plane, while the crystal grains 20Ba and 20Bc are oriented to the same (1 0 0) face (the indices for the rhombic crystals; the $(1\ 1\ 0)_p$ in the case of the quasi-cubic crystals), their in-plane [0 1 0] orientations respectively form an angle of about 120° and the crystal grains 20Bb and 20Bd which are oriented to the (1 1 2) face (the indices for the rhombic crystals; the $(1\ 1\ 0)_p$ in the case of the quasi-cubic crystals), are rotated by 120° in the plane with respect to each other.

While a number of substances for the CMR material are known including, for example, $Pr_{1-x}Ca_xMnO_3$(PCMO), $Pr_{1-x}(Ca, Sr)_xMnO_3$, $Nd_{0.5}Sr_{0.5}MnO_3$, $La_{1-x}Ca_xMnO_3$, $La_{1-x}Sr_xMnO_3$ and $Gd_{0.7}Ca_{0.3}BaCo_2O_{5+\delta}$, the suitable material used for the EPIR device of the present invention includes, among others, PCMO type materials which tend to form a charge ordering phase for blocking the occurrence of charge transfer resulting from their high strain in the network of the transition metal-oxygen bond. The PCMO type materials exhibit a greater EPIR effect and also tend to cause a fusion phenomenon of the charge ordering phase due to an external perturbation. In particular, compositions close to the phase boundary near x=0.3 are preferred.

The suitable substances for the lower electrode include the metals of platinum class which are high in lattice matching with the CMR material, high in electric conductivity and high in resistance to oxidation and represented by Pt (lattice constant a=0.3923 nm), Ir (lattice constant a=0.3839 nm), Rh (lattice constant a=0.3803 nm), and Pd (lattice constant a=0.389 nm), and also included are noble metal substances singly such as Au (lattice constant a=0.4079 nm) as well as alloys of these noble metals and various alloys using these metals as basic substances.

On the other hand, the upper electrode layer is not always exposed to a high temperature oxygen atmosphere. As a result, it is not limited to the previously mentioned noble metal elements and thus various materials including metals such as Al, Cu, Ni, Ti and Ta and oxide conducting materials are applicable.

While a silicon single crystal substrate may be used for the substrate, a glass substrate or the like may be used. When the EPIR device of the present invention is used as a memory, it is assumed that there will be frequent cases where diodes or transistors are connected to the memory and it should be preferable to select such a substrate that these devices can be formed on the same substrate.

It is to be noted that a barrier adhesion layer for reaction preventive and adhesion improving purposes is suitably inserted between the lower electrode layer and the base substrate layer. For example, there is the danger that an alloying phenomenon is caused between the Pt and Si due to a high temperature atmosphere during the CMR thin film layer formation thus giving rise to any inconvenience when using a silicon substrate and ensuring electric connections between the substrate and the lower electrode layer. Therefore, it is effective to insert Ti, TiN, $Ti_{1-x}Al_xN$, TaN, TiSiN, TaSiN or the like having conductivity and barrier properties as a barrier layer between the silicon substrate and the lower electrode layer. Also, where the silicon substrate surface is covered with an $SiO_2$ layer, it is more effective to use as the desired barrier layer an oxide $TiO_x$, $IrO_2$ or the like which has no danger of giving rise to any trouble due to oxidation, although it is of course possible to use the previously mentioned barrier layer composed of Ti or TiN.

While any of the known techniques such as the sputtering process, vacuum evaporation process or MOCVD process can be suitably used as the film forming technique for the lower electrode layer, it is preferable to use the sputtering process which permits the setting of a wider range of growth parameters from the standpoint of crystal grain orientation control, stress control and the like.

The various known processes such as the spin coating process, laser abrasion process, MBE process, sputtering process and MOCVD process can be used as the film forming technique for the CMR thin film layer; however, there are cases where it is necessary to effect a highly accurate film-formation parameter control at a relatively low film forming rate during the initial growth process or operation for epitaxial growth control purposes. In this case, the crystal growth control during the initial growth operation is important and a strict growth control after the growth of a film to several nm or over is not always necessary. Thus, it is possible to employ a film forming technique which divides the forming conditions into two steps in consideration of an improved mass productivity. Embodiments of the present invention will now be described.

<Embodiment 1>

Figure 2:
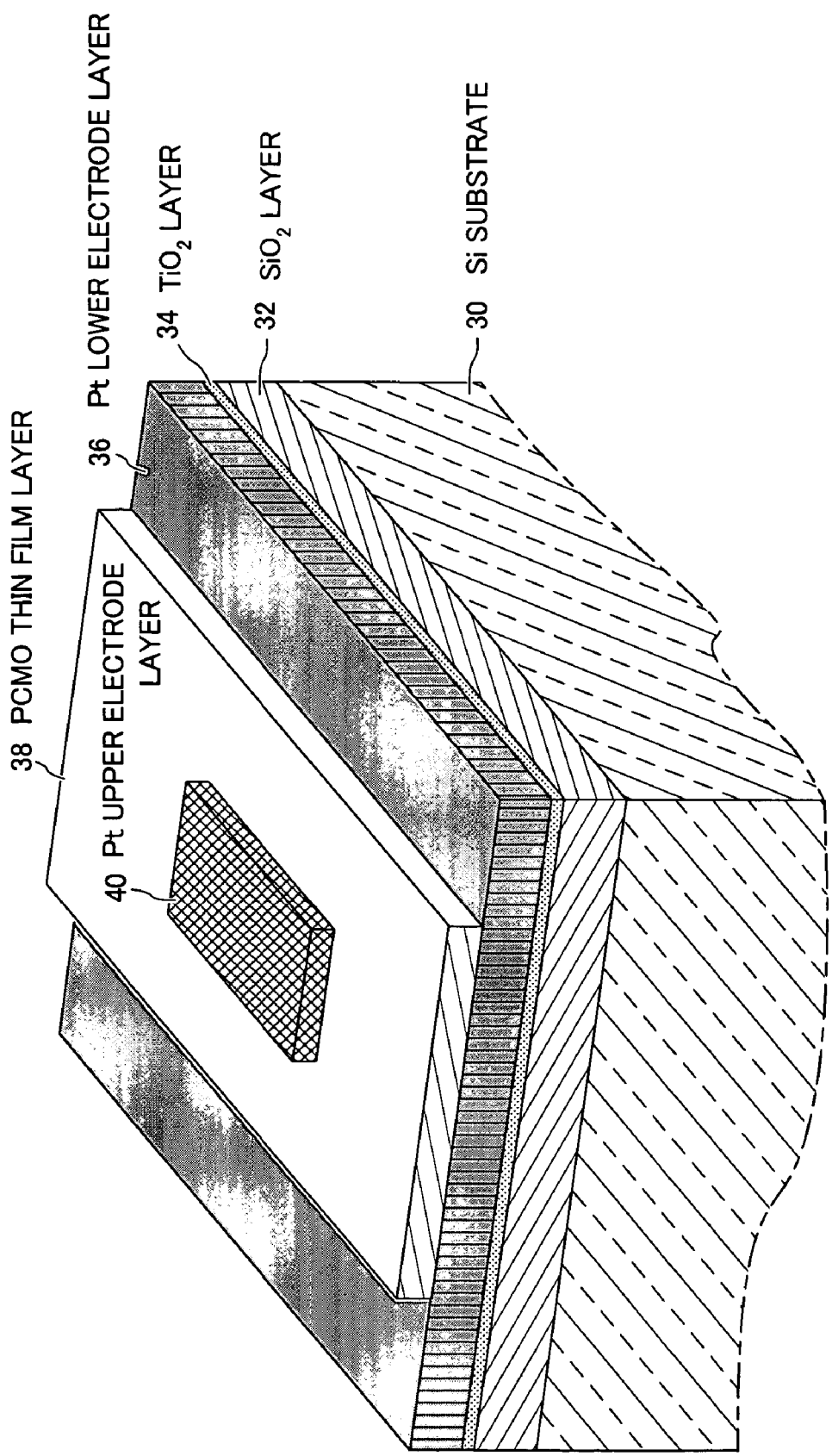
[FIG. 2] A perspective diagram showing the multilayer structure of an EPIR device according to Embodiment 1 of the present invention.

Firstly, Embodiment 1 of the present invention will be described with reference to the drawings. This embodiment is one relating to an EPIR device. FIG. 2 shows its multi-layered structure. In FIG. 2, an Si substrate 30 having an $SiO_2$ layer of 100 nm thick formed on its principal surface is prepared as a supporting or base substrate. Then, a $TiO_2$ layer 34 is formed as a barrier adhesion layer on the $SiO_2$ layer 32 of the Si substrate 30 by the reactive sputtering process.

Next, the Si substrate 30 which has been formed with the $SiO_2$ layer 32 and the $TiO_2$ layer 34 in this way, is heated to 400° C. and a Pt lower electrode layer 36 is formed as a noble metal electrode of 250 nm thick by the sputtering process using 100% Ar.

This Pt lower electrode layer 36 has been observed with an XRD (X-ray diffractometer) and a sectional TEM (transmission electron microscope) and it has been confirmed that it is mainly composed of columnar crystal grains of about 200 nm in grain size each having the outermost surface corresponding to a self-orientation closest packed structural face (1 1 1) and that about over 95% of these columnar crystal grains are oriented to the (1 1 1) face. However, these crystal grains have no in-plane crystallographical orientation relations with one another and the Pt lower electrode layer 36 has an uniaxial-orientation polycrystal structure.

Then, a thin film layer (PCMO thin film layer) 38 having the composition of $(Pr_{0.7}Ca_{0.3})MnO_3$ is formed as a CMR thin film layer on the Pt lower electrode layer 36 by the laser abrasion process. The film forming conditions include an $O_2$ atmosphere of 200 mTorr, a substrate temperature of 600° C. and a film forming rate of 8 nm/min thereby epitaxially growing locally to a film thickness of about 200 nm.

An XRD profile of the PCMO thin film layer 38 produced under these conditions is shown with the resulting X-ray diffraction graph shown in FIG. 3(A). In the Figure, the abscissa indicates the 2θ and the ordinate indicates the intensity. As shown in the Figure, the $(1\ 1\ 0)_p$ diffraction peak PA1 of the PCMO thin film layer 38 and the (1 1 1) diffraction peak PA2 of the Pt lower electrode layer 36 are clearly observed.

FIG. 3(B) shows a sectional TEM image of the multilayered portion of the Pt lower electrode layer 36 and the PCMO thin film layer 38. As shown in the Figure, (1 0 0)-oriented PCMO domains DA1 and (1 1 2)-oriented PCMO domains DA2 are formed on the Pt lower electrode layer 36. Note that these (1 0 0)-orientation and (1 1 2)-orientation belong to the $(1\ 1\ 0)_p$-orientation of the quasi-cubic crystals.

FIG. 4(A) shows a surface TEM image of the PCMO thin film layer 38. Also, FIG. 4(B) shows a regionally schematic view of FIG. 4(A). As shown in these Figures, the PCMO thin film layer 38 includes a large number of crystal grains. The above-mentioned (1 0 0)-oriented PCMO domain DA1 corresponds to a $(1\ 1\ 0)_p[=(1\ 0\ 0)]$-oriented PCMO columnar crystal grain RA1 and the (1 1 2)-oriented PCMO domain DA2 corresponds to a $(1\ 1\ 0)_p[=(1\ 1\ 2)]$-oriented PCMO columnar crystal grain RA2. It is to be noted that (1 1 1)P-oriented PCMO columnar crystal grains RB1 are also present in this exemplary case.

Figure 5:
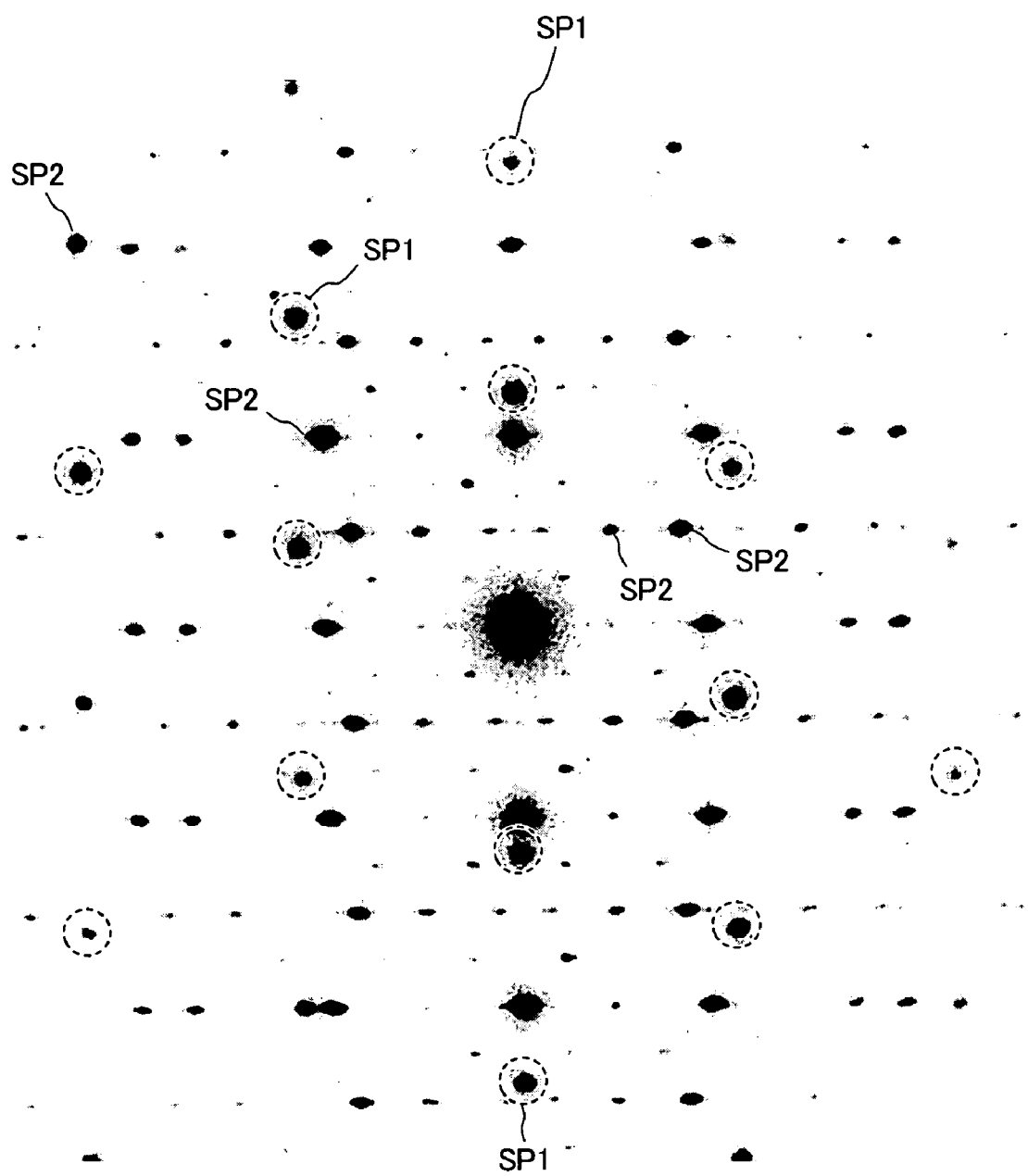
[FIG. 5] A diagram showing an electron beam diffraction image of the principal part in the Embodiment 1.

FIG. 5 shows a limited-field electron beam diffraction image of a portion containing a single Pt crystal grain and a plurality of PCMO columnar crystal grains grown on the former and having grain sizes of 20~30 nm. In the Figure, circled diffraction spots SP1 are the diffracted spots of the Pt lower electrode layer 36 oriented to the (1 1 1) direction and other diffraction spots SP2 (excluding a large spot at the center) are the diffraction spots of the PCMO thin film layer 38 oriented to the $(1\ 1\ 0)_p$ plane. These diffraction spots of the Pt lower electrode layer 36 and the PCMO thin film layer 38 are clearly observed.

Figure 3:
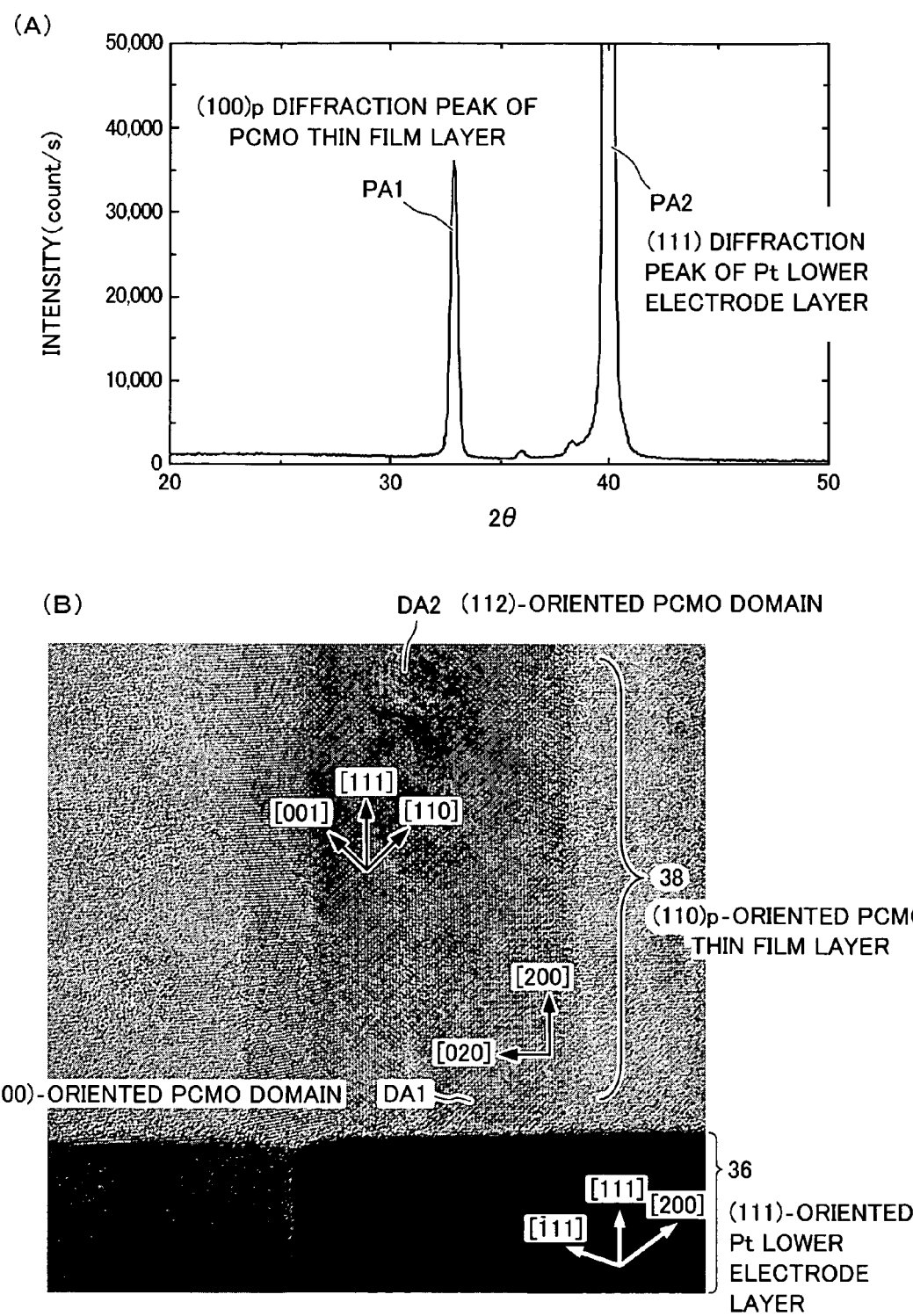
[FIG. 3] Diagrams showing the results of observation of the lower electrode and the CMR thin film in the Embodiment 1. (A) shows the result of observation by an XRD, and (B) shows the results of observation by a TEM.
Figure 4:
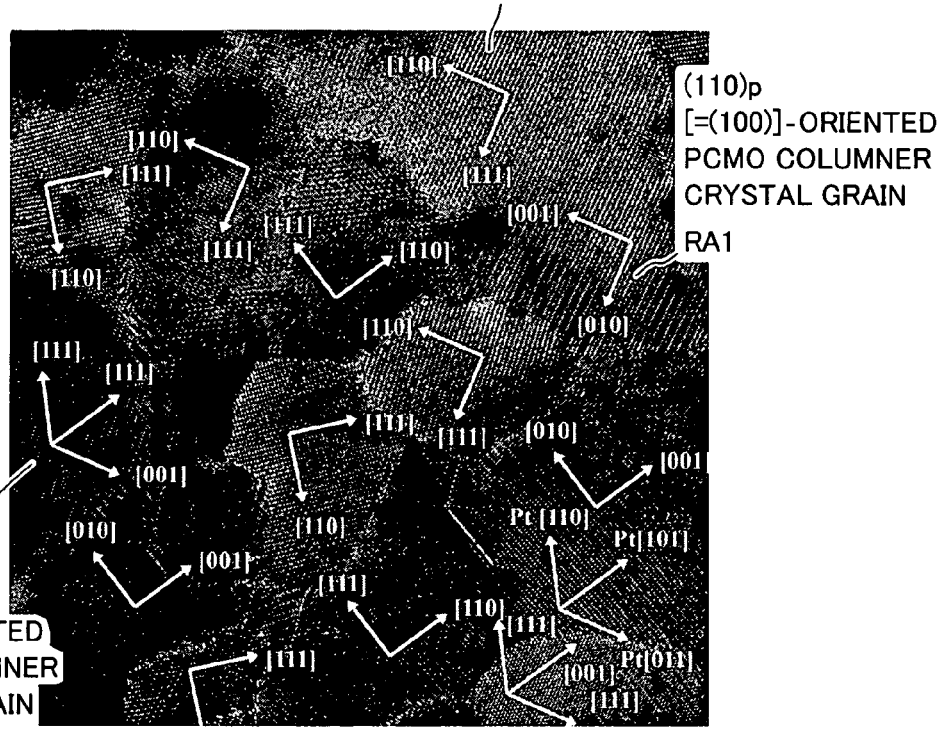
[FIG. 4] A diagram showing the direction of the crystal orientation of the CMR thin film surface in the Embodiment 1. (A) shows a TEM observation image, and (B) shows schematically its orientation direction.
Figure 4:
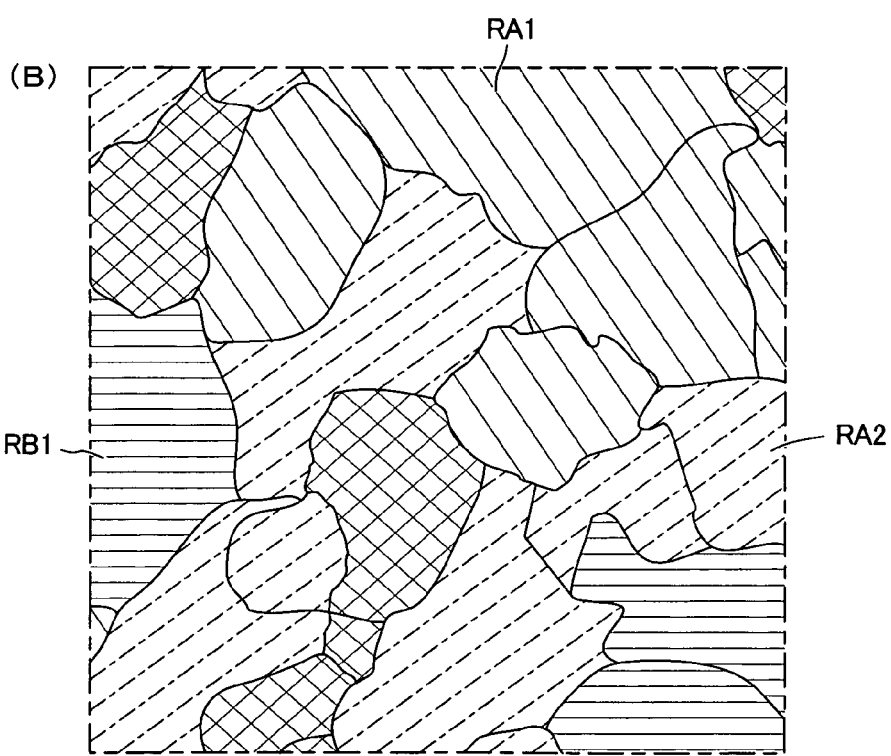

From these observation results of FIGS. 3 to 5 it will be seen that the crystal grains of the PCMO thin film have been grown with a definite crytallographical orientation relation or grown epitaxilly on the base material or the (1 1 1)-oriented Pt crystal grains. Also, at this time, the PCMO thin film layer 38 has been oriented to the $(1\ 1\ 0)_p$ plane with the degree of orientation of 93%.

Then, a Pt upper electrode layer 40 having a size of 200 μm square and thickness of 200 nm is formed with a metal mask on the PCMO thin film layer 38 formed in the above-mentioned manner. When this happens, there results an EPIR device of a basic structure in which the highly oriented CMR thin film layer is held between the electrode layers. Of course, it is possible to produce a plural number of the EPIR device in the surface of the Si substrate 30.

Figure 6:
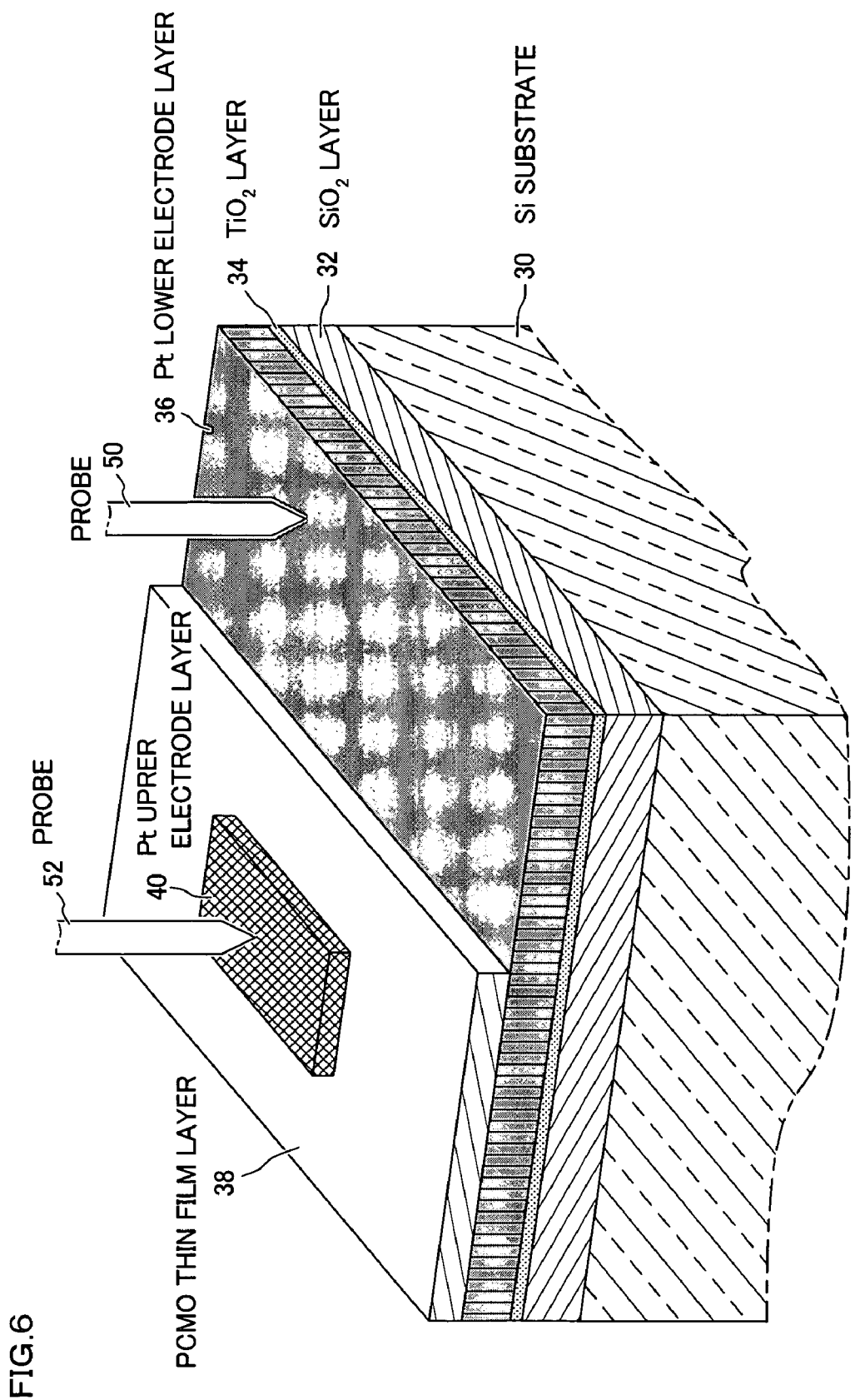
[FIG. 6] A diagram showing a measuring system for applying a pulse voltage to the EPIR device of Embodiment 1.

Then, utilizing the thus obtained simple EPIR device, its switching characteristics were evaluated with a measuring system shown in FIG. 6. More specifically, probes 50 and 52 were respectively pressed against the Pt lower electrode layer 36 and the Pt upper electrode layer 40 for contacting purposes. Then, a pulse voltage was applied across the upper and lower electrode layers using the upper electrode layer side as a positive electrode and the resulting resistance values between the upper and lower electrodes were measured. In other words, how the resistance was changed by the pulse application from the initial state of the [0] applied pulse voltage was measured.

FIG. 7(A) shows the variation in the resistance value of the EPIR device in a case where the pulse voltage width was set to 100 ns and the pulse voltage value was varied. In the Figure, the abscissa represents the applied pulse voltage value [V] and the ordinate represents the resistance value [Ω] (logarithmic scale). Note that the symbol [E] on the ordinate represents the power of 10. For example, [1.0E+03] represents $1.0 \times 10^3$.

As shown in the Figure, practically there was no change in the resistance value when the applied pulse voltage was 1 [V]. However, the application of the pulse voltage of 4 [V] varied the resistance value by about a number of two figures as compared with the initial state. Further, the application of the pulse voltage of 5 [V] varied the resistance value by a range of exceeding a number of three figures, and the application of over 5 [V] caused the resistance value to saturate.

FIG. 7(B) is a graph showing the variation of the resistance when a pulse voltage having a voltage value of 5 [V] and a pulse duration of 100 ns was applied alternately to the upper and lower electrode layers 36 and 40. In the Figure, the measurement points on the low resistance side show the case where the pulse voltage was applied such that the lower electrode side became positive and the upper electrode side became negative, and the measurement points on the high resistance side show the case where the pulse voltage was applied such that the upper electrode side became positive and the lower electrode side became negative. As shown in the Figure, there was the occurrence of switching between the low resistance state and the high resistance state over a wide dynamic range of about a number of three figures upon the polarity reversal of the pulse voltage.

On the other hand, as an comparative example, an EPIR device was manufactured in which a polycrystal Pt lower electrode layer was formed on a Si substrate having an $SiO_2$ thermal oxide film and formed with a barrier layer $TiO_2$, and a PCMO thin film layer was grown on the lower electrode layer. Note that no orientation control was effected on the PCMO thin film. This comparative example was subjected to the same XRD as in FIG. 3(A) and the results obtained are shown in FIG. 10(A). As shown in the Figure, PB1 to PB3 were observed as the diffraction peaks of the PCMO thin film showing its non-orientation properties, and PB4 was observed as the diffraction peak of the Pt lower electrode.

The same measurements as in FIG. 7(B) were effected on this EPIR device of the comparative example and the results shown in FIG. 10(B) were obtained. As shown in the Figure, the resistance value was varied only by about a number of single figure and it was clear that the present embodiment was superior. Also, a large number of the EPIR device were formed on a substrate surface and their variations in characteristics were examined, with the result that the variations were about less than ±10% and it was ±30% in the case of the comparative example showing a marked improvement with respect to the in-plane uniformity. These improvements in characteristics were considered to be due to the following structural features:

(1) The orientation control of the PCMO crystal grains.
(2) The large number of the columnar PCMO crystal grains were formed on the columnar Pt lower electrode crystal grains.

<Embodiment 2>

Next, Embodiment 2 of the present invention will be described. After a polycrystal Pt lower electrode layer 36 of the (1 1 1) orientation has been formed, a $(Pr_{0.7}Ca_{0.3})\ MnO_3$ thin film layer (PCMO thin film layer) is locally grown epitaxially to a film thickness of about 5 nm by the laser abrasion process using an $O_2$ atmosphere of 20 mTorr and a substrate temperature of 600° C. at a low growth rate with a film forming rate of 2 nm/min.

It has been confirmed by the TEM observation that the $(1\ 1\ 1)_p$ plane which is most excellent in lattice matching with the Pt (1 1 1) crystal face and low in boundary energy is preferentially grown at such low growth rate. Also, the crystal orientation of the PCMO layer which is to be formed then consecutively is primarily determined by the orientation properties of the initially grown layer due to the extremely large contribution of the boundary energy even if the deposition rate is varied somewhat. Thus, if the layer is grown to a formed film thickness of about 200 nm on the initial PCMO grown layer by changing only the film forming rate to 10 nm/min, over 80% of the PCMO thin film layer obtained shows the preferred $(1\ 1\ 1)_p$ orientation.

Figure 7:
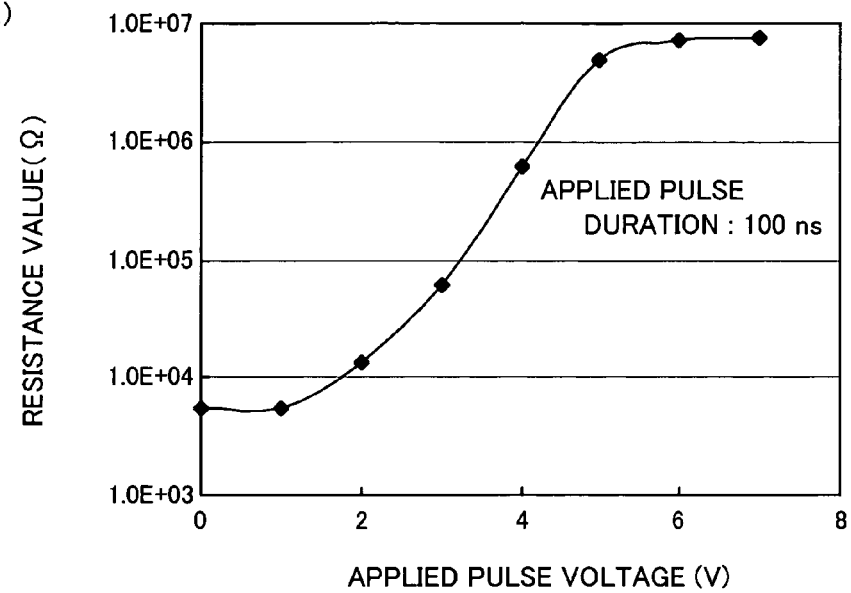
[FIG. 7] Diagrams showing the results of measurement by the measuring system of FIG. 6. (A) is a graph showing the variation in resistance when the pulse voltage is varied. (B) is a graph showing the variation in resistance when the pulse polarity is changed.
Figure 7:
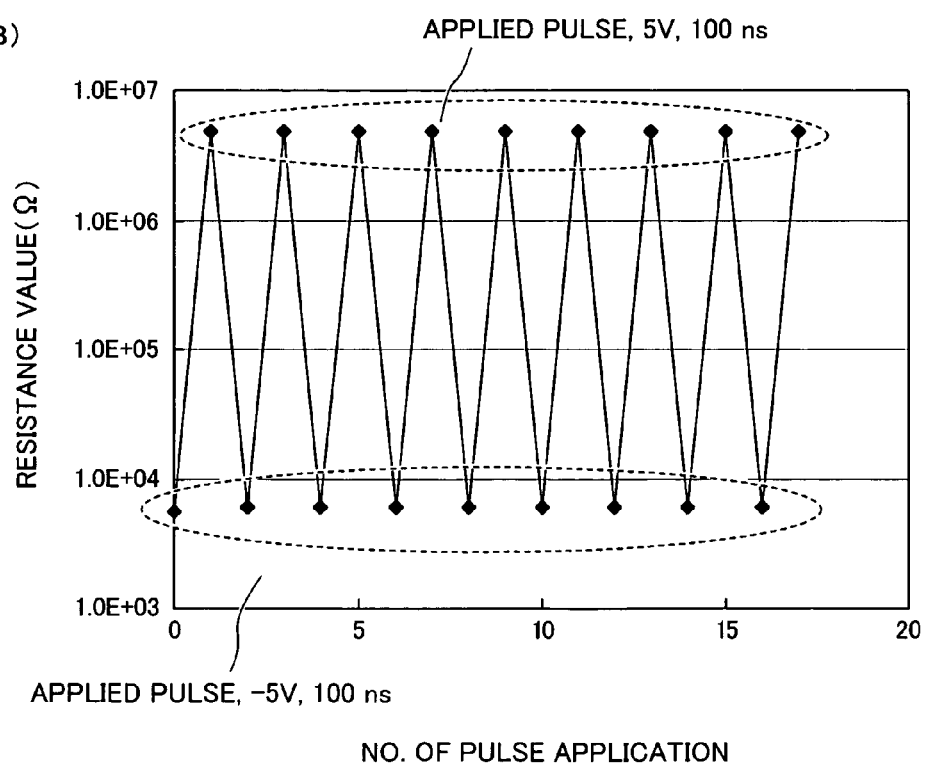

With the EPIR device of this embodiment, in the same way as in FIG. 7 (B), a pulse voltage of 5 V/100 ns was applied alternately across the upper and lower electrodes to determine its switching characteristics and a wide resistance variation of dynamic range extending to about a number of three figures was obtained. Also, with the problem of the in-plane uniformity, the variation in characteristics in the substrate surface was remarkably improved to fall within ±10%.

<Embodiment 3>

Figure 8:
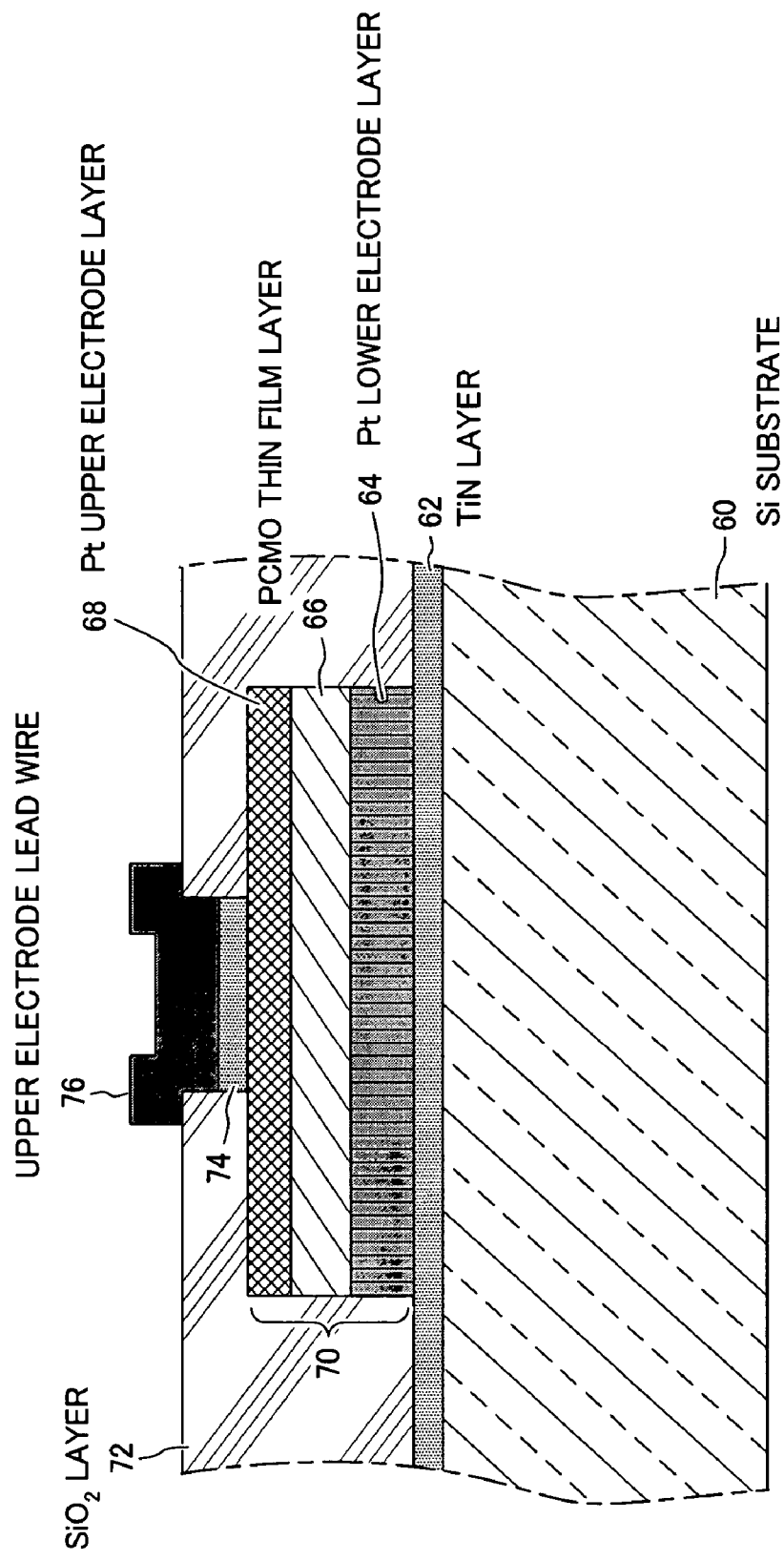
[FIG. 8] A sectional view showing the principal portion of the EPIR device according to Embodiment 3 of the invention.
Figure 9:
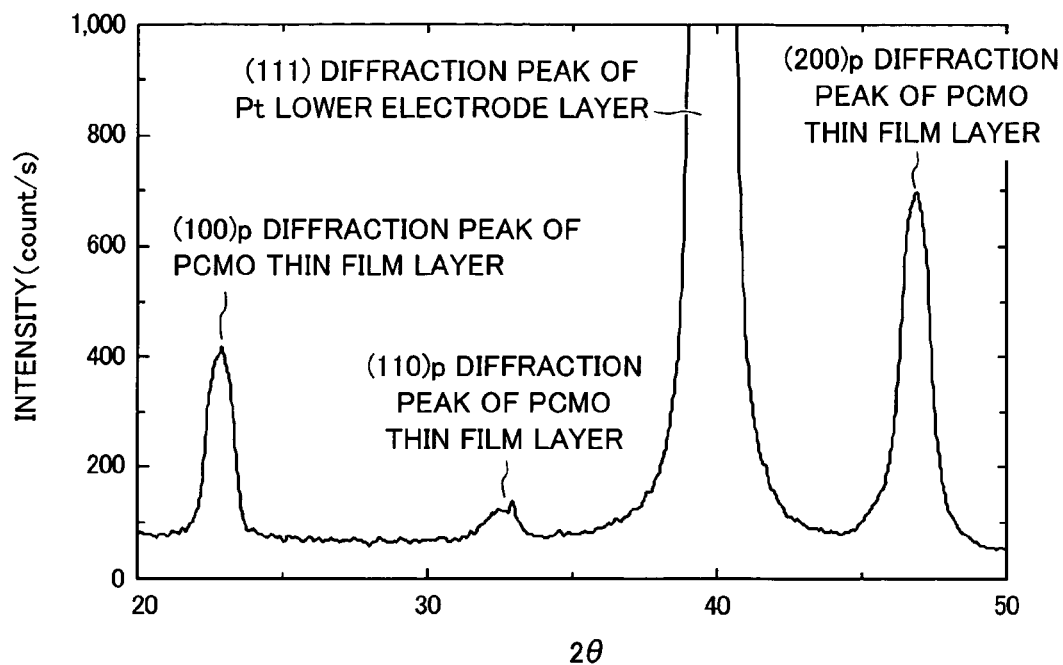
[FIG. 9] Diagrams showing the results of observation of the lower electrode and the CMR thin film and the variation in resistance in the Embodiment 3. (A) shows the results of observation by an XRD, and (B) shows the variation in resistance upon the application of the pulse reversed in polarity.
Figure 9:
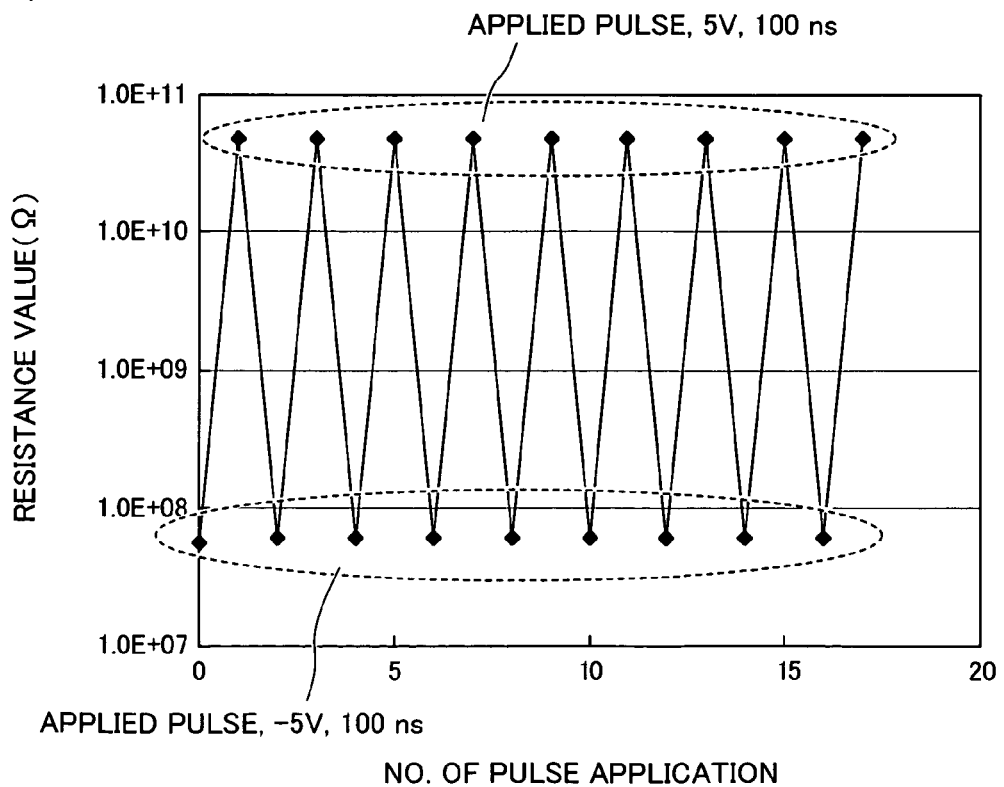

Embodiment 3 of the present invention will now be described with reference to FIGS. 8 and 9. FIG. 8 shows the multilayer structure of an EPIR device according to the present embodiment. In the present embodiment, a low resistance Si substrate 60 subjected to a high-density impurity doping is used as a base substrate.

A TiN layer 62 is first formed on the principal surface of the Si substrate 60 by the reactive sputtering process. This TiN layer 62 is provided so as to not only provide an electric contact between a lower electrode layer and the Si substrate 60 of the EPIR device but also prevent any reaction between the material of the lower electrode layer and the material of the Si substrate 60. Then, the Si substrate 60 formed with this TiN layer 62 is heated to 400° C. and the Pt lower electrode layer 64 of 250 nm thick is formed by the sputtering process using 100% Ar. It has been confirmed that this Pt lower electrode layer 64 has the (1 1 1)-oriented polycrystal columnar structure of about 200 nm in grain size and about over 90% of the Pt crystal grains is oriented to the (1 1 1) face.

Then, a PCMO or $(Pr_{0.7}Ca_{0.3})MnO_3$ is locally grown epitaxially to a film thickness of about 200 nm on the Pt lower electrode layer 64 by the magnetron sputtering process using an $O_2$ atmosphere of 14 mTorr, a substrate temperature of 600° C. and a film forming rate of 10 nm/min. The PCMO thin film layer 66 prepared under these conditions was measured by the XRD and the results shown in FIG. 9(A) were obtained. The results showed that the PCMO thin film layer 66 had the $(1\ 0\ 0)_p$ preferred orientation. Also, it was confirmed from the sectional TEM image that the layer 66 was locally grown epitaxially on the Pt lower electrode layer 64 oriented to the (1 1 1) face. The degree of $(1\ 0\ 0)_p$ orientation of the PCMO thin film layer 66 under these conditions was 89%.

Next, a Pt upper electrode layer 68 is formed to a thickness of 200 nm on the PCMO thin film layer 66. Then, a hard mask is patterned by the photolithographic process and the Pt upper electrode layer 68, the PCMO thin film layer 66 and Pt lower electrode layer 64 are processed by the plasma ion etching using $BCl_3/Ar$. As a result, a small EPIR device 70 of 2 µm² square is formed in which the CMR thin film layer having a high degree of orientation is held between the electrode layers. Then, an $SiO_2$ layer 72 is formed as an insulating film over the whole principal surface of the Si substrate 60 by the plasma CVD process.

Next, a via hole 74 is opened and formed for wire interconnection purposes in the $SiO_2$ layer 72 in the Pt upper electrode layer 68 by means of the photolithography process and the plasma etching process. Then, an upper electrode lead wire 76 made of Al/TiNi is formed for interconnection with the Pt upper electrode layer 68.

A pulse voltage was applied to the thusly produced EPIR device 70 in the same manner as in the case of the previously mentioned embodiments. In the case of this embodiment, the pulse voltage of 5 V/100 ns was applied across the conductive Si substrate 60 and the Al/TiN upper electrode lead wire 76 in such a manner that the pulse was reversed in polarity alternately. The resulting resistance variation of the EPIR device 70 is shown in FIG. 9(B). As shown in the Figure, it is seen that in the present embodiment the switching was effected between the low resistance state and the high resistance state in a wide dynamic range extending over about a number of three figures. The range of this resistance variation was extremely wide as compared with the EPIR device of a high crystallizability shown in FIG. 10. Also, as regards the in-plane uniformity, the variation in characteristics in the substrate surface among the EPIR devices was remarkably improved to be about less than ±15% in the case of the 6-inch substrate surface.

<Other Embodiments>

There are a large number of embodiments of the present invention and it is possible to make many changes and modifications to these embodiments on the basis of the above-mentioned disclosure. For example, the following are included.

(1) The above-mentioned manufacturing methods, manufacturing conditions and the materials of the various parts have been shown by way of examples so that the present invention is not limited to the previously mentioned embodiments and they may be suitably modified to perform the same functions.

(2) The present invention is applicable to not only the previously stated nonvolatile random access memories but also variable resistance elements, infrared sensors and the like.

As described hereinabove, in accordance with the present invention, a CMR material thin film is locally grown epitaxially on a noble-metal lower electrode layer showing a uniaxial orientation so as to form a multilayer structure of electrode/CMR material/electrode including the CMR material showing a high degree of preferred crystal orientation in a substrate surface normal direction and thus the following effects are obtained.

(1) By virtue of the polycrystal thin film structure, the device is excellent in mass productivity and high in practical utility.

(2) It is possible to attain the improved EPIR characteristics, the improved uniformity in characteristics in the substrate surface and the improved lot-to-lot process reproducibility.

What is claimed is:

1. An EPIR device of a structure in which a lower electrode layer, a CMR material thin film layer and an upper electrode layer are laminated in this order, characterized in that:

said lower metal electrode layer is made of a metal material whose principal component is comprised of a noble metal singly or an alloy thereof, a large part of said lower metal electrode layer being oriented to a (1 1 1) face, and a large part of crystal grains of said CMR material thin film layer is locally grown epitaxially on metal crystal grains of said lower metal electrode layer whose outermost surfaces are said (1 1 1) face.

2. An EPIR device as set forth in claim 1, characterized in that said lower electrode layer is made of a metal material whose principal component is comprised of a platinum class metal singly or an alloy thereof.

3. An EPIR device as set forth in claim 1, characterized in that said lower electrode layer is made of platinum.

4. An EPIR device as set forth in claim 1, characterized in that when forming said EPIR device on said substrate, a barrier layer is formed between said substrate and said lower electrode layer to prevent the occurrence of reaction therebetween.

5. An EPIR device as set forth in claim 1, characterized in that the arrangement of the crystal orientations of said lower metal electrode layer in the substrate surface normal direction is such that over 60% thereof is oriented to said (1 1 1) face.

6. An EPIR device as set forth in claim 1, characterized in that the arrangement of the crystal orientations of said lower metal electrode layer in said substrate surface normal direction is such that over 90% thereof is oriented to said (1 1 1) face.

7. An EPIR device as set forth in claim 1, characterized in that over 60% of the crystal grains of said CMR material thin film layer is locally grown epitaxially on the metal crystal grains of said lower metal electrode layer whose outermost surfaces are said (1 1 1) face to which the crystal orientations of said lower metal electrode layer in said substrate surface normal direction are directed, and that said over 60% of the crystal grains of said CMR material thin film layer is oriented to any one of $(1\ 0\ 0)_p$, $(1\ 1\ 0)_p$ and $(1\ 1\ 1)_p$ planes.

8. An EPIR device as set forth in claim 1, characterized in that over 80% of the crystal grains of said CMR material thin film layer is locally grown epitaxially on the metal crystal grains of said lower metal electrode layer whose outermost surfaces are said (1 1 1) face to which the crystal orientations of said lower metal electrode layer in the substrate surface normal direction are directed, and that said over 80% of the crystal grains of said CMR material thin film layer is oriented to any one of $(1\ 0\ 0)_p$, $(1\ 1\ 0)_p$ and $(1\ 1\ 1)_p$ planes.

9. A semiconductor device characterized in that said semiconductor device comprises at least one of said EPIR device set forth in claim 1.

10. An EPIR device of a structure in which a lower electrode layer, a CMR material thin film layer and an upper electrode layer are laminated in this order, characterized in that:

said lower electrode layer is made of a metal material whose principal component is comprised of a noble metal singly or an alloy thereof, a large part of crystal grains of said CMR material thin film layer is locally grown epitaxially on crystal grains of said lower metal electrode layer, and said epitaxially grown crystal grain groups of said CMR material thin film layer have crystal faces vertical in a substrate surface normal direction and corresponding to one of $(1\ 0\ 0)_p$, $(1\ 1\ 0)_p$ and $(1\ 1\ 1)_p$ planes.

11. An EPIR device as set forth in claim 10, characterized in that said lower electrode layer is made of a metal material whose principal component is comprised of a platinum class metal singly or an alloy thereof.

12. An EPIR device as set forth in claim 10, characterized in that said lower electrode layer is made of platinum.

13. An EPIR device as set forth in claim 10, characterized in that when forming said EPIR device on said substrate, a barrier layer is formed between said substrate and said lower electrode layer to prevent the occurrence of reaction therebetween.

14. An EPIR device as set forth in claim 10, characterized in that the arrangement of the crystal orientations of said lower metal electrode layer in the substrate surface normal direction is such that over 60% thereof is oriented to said (1 1 1) face.

15. An EPIR device as set forth in claim 10, characterized in that the arrangement of the crystal orientations of said lower metal electrode layer in said substrate surface normal direction is such that over 90% thereof is oriented to said (1 1 1) face.

16. An EPIR device as set forth in claim 10, characterized in that over 60% of the crystal grains of said CMR material thin film layer is locally grown epitaxially on the metal crystal grains of said lower metal electrode layer whose outermost surfaces are said (1 1 1) face to which the crystal orientations of said lower metal electrode layer in said substrate surface normal direction are directed, and that said over 60% of the crystal grains of said CMR material thin film layer is oriented to any one of $(1\ 0\ 0)_p$, $(1\ 1\ 0)_p$ and $(1\ 1\ 1)_p$ planes.

17. An EPIR device as set forth in claim 10, characterized in that over 80% of the crystal grains of said CMR material thin film layer is locally grown epitaxially on the metal crystal grains of said lower metal electrode layer whose outermost surfaces are said (1 1 1) face to which the crystal orientations of said lower metal electrode layer in the substrate surface normal direction are directed, and that said over 80% of the crystal grains of said CMR material thin film layer is oriented to any one of $(1\ 0\ 0)_p$, $(1\ 1\ 0)_p$ and $(1\ 1\ 1)_p$ planes.

18. A semiconductor device characterized in that said semiconductor device comprises at least one of said EPIR device set forth in claim 10.

19. An EPIR device of a structure in which a lower electrode layer, a CMR material thin film layer and an upper electrode layer are laminated in this order, characterized in that:

said lower electrode layer is made of a metal material whose principal component is a noble metal singly or an alloy thereof, a large part of said lower electrode layer being oriented to a (1 1 1) face, and a large part of crystal grains of said CMR material thin film layer are locally grown epitaxially on metal crystal grains of said lower metal electrode layer, the outermost surface of each said metal crystal grains corresponding to said (1 1 1) face, said epitaxially grown crystal grain groups of said CMR material thin film layer having crystal faces vertical in a substrate surface normal direction and corresponding to one of $(1\ 0\ 0)_p$, $(1\ 1\ 0)_p$ and $(1\ 1\ 1)_p$ planes.

20. An EPIR device as set forth in claim 19, characterized in that said lower electrode layer is made of a metal material whose principal component is comprised of a platinum class metal singly or an alloy thereof.

21. An EPIR device as set forth in claim 19, characterized in that said lower electrode layer is made of platinum.

22. An EPIR device as set forth in claim 19, characterized in that when forming said EPIR device on said substrate, a barrier layer is formed between said substrate and said lower electrode layer to prevent the occurrence of reaction therebetween.

23. An EPIR device as set forth in claim 19, characterized in that the arrangement of the crystal orientations of said lower metal electrode layer in the substrate surface normal direction is such that over 60% thereof is oriented to said (1 1 1) face.

24. An EPIR device as set forth in claim 19, characterized in that the arrangement of the crystal orientations of said lower metal electrode layer in said substrate surface normal direction is such that over 90% thereof is oriented to said (1 1 1) face.

25. An EPIR device as set forth in claim 19, characterized in that over 60% of the crystal grains of said CMR material thin film layer is locally grown epitaxially on the metal crystal grains of said lower metal electrode layer whose outermost surfaces are said (1 1 1) face to which the crystal orientations of said lower metal electrode layer in said substrate surface normal direction are directed, and that said over 60% of the crystal grains of said CMR material thin film layer is oriented to any one of $(1\ 0\ 0)_p$, $(1\ 1\ 0)_p$ and $(1\ 1\ 1)_p$ planes.

26. An EPIR device as set forth in claim 19, characterized in that over 80% of the crystal grains of said CMR material thin film layer is locally grown epitaxially on the metal crystal grains of said lower metal electrode layer whose outermost surfaces are said (1 1 1) face to which the crystal orientations of said lower metal electrode layer in the substrate surface normal direction are directed, and that said over 80% of the crystal grains of said CMR material thin film layer is oriented to any one of $(1\ 0\ 0)_p$, $(1\ 1\ 0)_p$ and $(1\ 1\ 1)_p$ planes.

27. A semiconductor device characterized in that said semiconductor device comprises at least one of said EPIR device set forth in claim 19.

* * * * *